US012669857B2

(12) United States Patent
Goergen et al.

(10) Patent No.: US 12,669,857 B2
(45) Date of Patent: Jun. 30, 2026

(54) POWER DISTRIBUTION AND COMMUNICATION INFRASTRUCTURE FOR CONNECTED APPLIANCES

(71) Applicant: Cisco Technology, Inc., San Jose, CA (US)

(72) Inventors: Joel Richard Goergen, Soulsbyville, CA (US); Angelo Fienga, Rome (IT); Maria Soledad Palmero Amador, Toledo (ES); Hazim Hashim Dahir, Wake Forest, NC (US)

(73) Assignee: CISCO TECHNOLOGY, INC., San Jose, CA (US)

(*) Notice: Subject to any disclaimer, the term of this patent is extended or adjusted under 35 U.S.C. 154(b) by 231 days.

(21) Appl. No.: 18/345,151

(22) Filed: Jun. 30, 2023

(65) Prior Publication Data

US 2025/0004520 A1 Jan. 2, 2025

(51) Int. Cl.
*G06F 1/26* (2006.01)
*H04L 12/10* (2006.01)
*H05K 7/14* (2006.01)

(52) U.S. Cl.
CPC .............. *G06F 1/266* (2013.01); *H04L 12/10* (2013.01); *H05K 7/1485* (2013.01)

(58) Field of Classification Search
CPC .............................. Y02T 10/7072; Y02T 90/12
USPC ........................................................ 700/295
See application file for complete search history.

(56) References Cited

U.S. PATENT DOCUMENTS

| | | | | |
|---|---|---|---|---|
| 6,853,291 | B1 * | 2/2005 | Aisa .................. | H02J 13/00002 340/3.3 |
| 10,135,262 | B2 * | 11/2018 | Solomon ................. | G06F 21/31 |
| 10,220,719 | B2 * | 3/2019 | Haas ....................... | B60L 53/62 |
| 10,744,883 | B2 * | 8/2020 | Quattrini, Jr. ......... | H02J 7/0013 |
| 11,063,630 | B2 | 7/2021 | Arduini et al. | |
| 11,456,883 | B2 | 9/2022 | O'Brien et al. | |
| 11,621,565 | B2 | 4/2023 | Goergen et al. | |

(Continued)

OTHER PUBLICATIONS

Tim McPhie et al., "Zero emission vehicles: first 'Fit for 55' deal will end the sale of new CO2 emitting cars in Europe by 2035," European Commission, Press release, Oct. 28, 2022, 4 pages, https://ec.europa.eu/commission/presscorner/detail/en/ip_22_6462.

(Continued)

*Primary Examiner* — Brian T Misiura
(74) *Attorney, Agent, or Firm* — Edell, Shapiro & Finnan, LLC

(57) ABSTRACT

Power distribution and communications infrastructure for electric appliances and systems of electric appliances. Specifically, an electric appliance includes a housing, a network interface configured to enable network communications, and at least one primary appliance component that is housed within the housing and that performs a primary function of the electric appliance. The electric appliance further includes at least one server that is housed within the housing and includes at least one processor configured to perform one or more data center functions. The electric appliance further includes a power module that supplies power to the at least one primary appliance component that performs the primary function of the electric appliance and that supplies residual power to the at least one server that performs the one or more data center functions.

20 Claims, 8 Drawing Sheets

(56)          References Cited

U.S. PATENT DOCUMENTS

| | | | |
|---|---|---|---|
| 11,681,348 B2 * | 6/2023 | de Rochemont ....... | H01L 25/04 |
| | | | 700/293 |
| 11,941,612 B2 * | 3/2024 | Park ..................... | G06Q 20/065 |
| 2011/0283119 A1 | 11/2011 | Szu et al. | |
| 2012/0324245 A1 | 12/2012 | Sinha et al. | |
| 2014/0361745 A1 | 12/2014 | Nishita et al. | |
| 2015/0301547 A1 | 10/2015 | Johansson | |
| 2018/0018007 A1 | 1/2018 | Dorn et al. | |
| 2021/0264068 A1 | 8/2021 | Goergen et al. | |
| 2022/0032804 A1 | 2/2022 | Goergen | |
| 2022/0063429 A1 | 3/2022 | Goergen et al. | |
| 2022/0080853 A1 * | 3/2022 | Goldfarb ............ | G01R 31/3647 |
| 2022/0085603 A1 | 3/2022 | Mcnamara et al. | |
| 2022/0134901 A1 | 5/2022 | Wang | |
| 2022/0305927 A1 | 9/2022 | Haas et al. | |
| 2024/0140253 A1 * | 5/2024 | Bennett ................... | B60L 53/67 |
| 2024/0149731 A1 * | 5/2024 | Ropel ..................... | B60L 53/11 |
| 2024/0332984 A1 * | 10/2024 | Kissick ..................... | H04L 9/50 |
| 2024/0416789 A1 * | 12/2024 | Jones ...................... | B60L 53/68 |

OTHER PUBLICATIONS

"Electric Vehicle Charging Station Market Size," Precedence Research, retrieved from the Internet Mar. 13, 2023, 12 pages, https://www.precedenceresearch.com/electric-vehicle-charging-station-market#:~: text=What%20is%20the%20current%20size,USD%20417.35%20billion%20by%2020230.

SkyQuest Technology Consulting Pvt. Ltd., "Global Electric Vehicle Charging Station Market to Have Over 16.83 Million Charging Stations by 2028 | Over 600,000 DC chargers are Already Present in the World," GlobalNewswire, Nov. 23, 2022, 7 pages, https://www.globenewswire.com/en/news-release/2022/11/23/2561825/0/en/Global-Electric-Vehicle-Charging-Station-Market-to-Have-Over-16-83-Million-Charging-Stations-by-2028-Over-600-000-DC-chargers-are-Already-Present-in-the-World.html.

Julian Conzade, et al., "Europe's EV opportunity—and the charging infrastructure needed to meet it," Mckinsey & Company, Nov. 4, 2022, 11 pages, https://www.mckinsey.com/industries/automotive-and-assembly/our-insights/europes-ev-opportunity-and-the-charging-infrastructure-needed-to-meet-it.

Loren McDonald, "EV Charging Statistics," Evadoption, Dec. 31, 2021, 5 pages, https://evadoption.com/ev-charging-stations-statistics/.

Rick Wolbertus, et al., "Benchmarking Charging Infrastructure Utilization," World Electric Vehicle Journal, vol. 8, EVS29 Symposium, Jun. 19-22, 2016, 18 pages.

Eva von der Weppen, "Modular and economical setup of DC charging infrastructure with 19" racks," Phoenix Contact, Apr. 28, 2023, 2 pages, https://www.phoenixcontact.com/en-in/events-and-news/news/modular-and-economical-setup-of-dc-charging-infrastructure-with-19-racks.

* cited by examiner

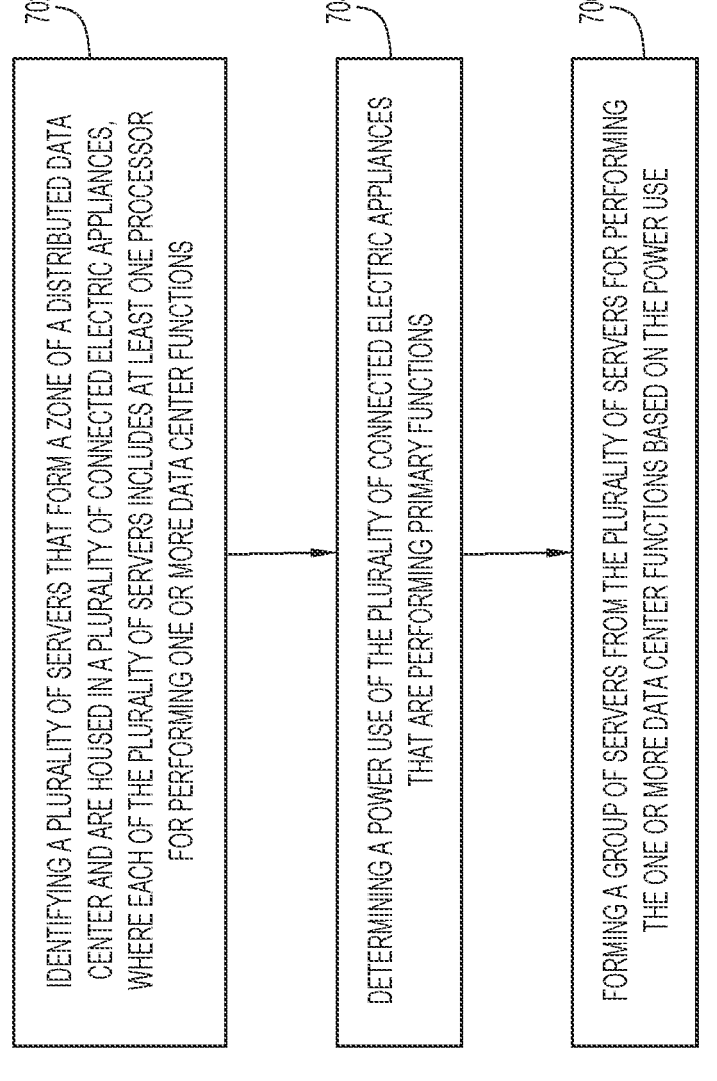

702

IDENTIFYING A PLURALITY OF SERVERS THAT FORM A ZONE OF A DISTRIBUTED DATA CENTER AND ARE HOUSED IN A PLURALITY OF CONNECTED ELECTRIC APPLIANCES, WHERE EACH OF THE PLURALITY OF SERVERS INCLUDES AT LEAST ONE PROCESSOR FOR PERFORMING ONE OR MORE DATA CENTER FUNCTIONS

704

DETERMINING A POWER USE OF THE PLURALITY OF CONNECTED ELECTRIC APPLIANCES THAT ARE PERFORMING PRIMARY FUNCTIONS

706

FORMING A GROUP OF SERVERS FROM THE PLURALITY OF SERVERS FOR PERFORMING THE ONE OR MORE DATA CENTER FUNCTIONS BASED ON THE POWER USE

POWER DISTRIBUTION AND COMMUNICATION INFRASTRUCTURE FOR CONNECTED APPLIANCES

TECHNICAL FIELD

The present disclosure generally relates to power distribution and communication.

BACKGROUND

Computation and hosting resources, commonly referred to as data center functions, are in high demand. To accommodate this demand, data centers have been expanding and new data centers are being developed. Data centers, however, are expensive to build and maintain. Due to the massive cost of building or expanding data centers, there has been a push to look for alternative methods to expand the compute footprint and the application hosting footprint. In addition, a demand for edge-compute capabilities as close as possible to the application users has created a need for flexible, low-cost, and easy-to-deploy/provision environments.

BRIEF DESCRIPTION OF THE DRAWINGS

FIG. 7 is a flow diagram illustrating a method of forming a group of servers for performing one or more data center functions based on power use, according to an example embodiment.

DETAILED DESCRIPTION

Overview

Figure 1:
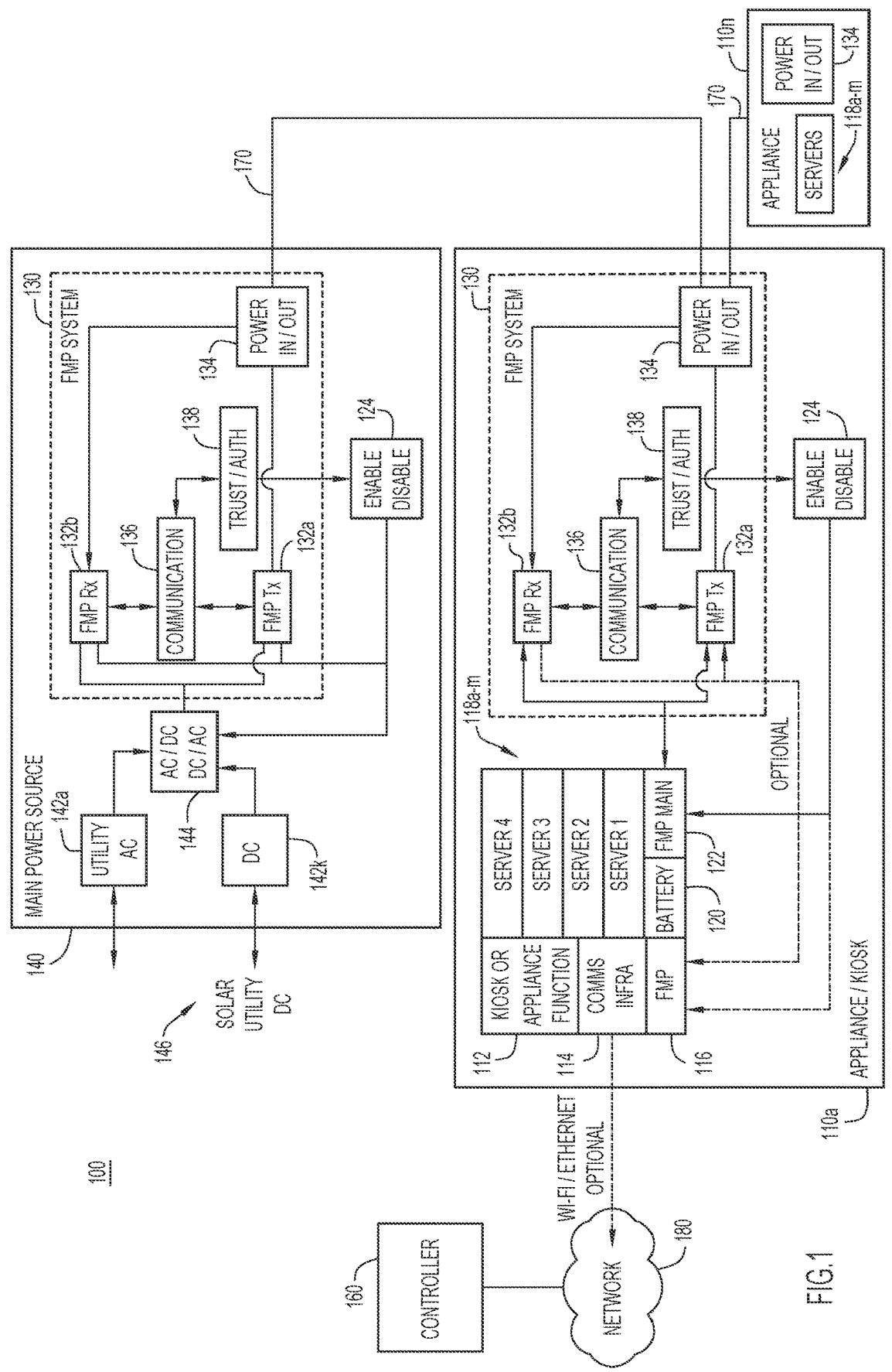
FIG. 1 is a block diagram illustrating a system of connected appliances with shared power distribution and communication, according to an example embodiment.

Techniques presented herein provide multiple server blades in large appliances such as vending machines, gaming machines, kiosks, or other connected appliances.

In one form, an electric appliance is provided. The electric appliance includes a housing, a network interface configured to enable network communications, and at least one primary appliance component that is housed within the housing and that performs a primary function of the electric appliance. The electric appliance further includes at least one server that is housed within the housing and includes at least one processor configured to perform one or more data center functions. The electric appliance further includes a power module that supplies power to the at least one primary appliance component that performs the primary function of the electric appliance and that supplies residual power to the at least one server that performs the one or more data center functions.

In another form, a system is provided. The system includes a plurality of electric appliances each including one or more servers that are a part of a distributed data center. Each of the plurality of electric appliances performs a primary function. The system further includes a bi-directional power and data connector installed in each of the plurality of electric appliances for receiving and/or transmitting power and data and at least one power source that provides power to one or more of the plurality of electric appliances.

In yet another form, a method is provided. The method involves identifying a plurality of servers that form a zone of a distributed data center and are housed in a plurality of connected electric appliances. Each of the plurality of servers includes at least one processor for performing one or more data center functions. The method further involves determining a power use of the plurality of connected electric appliances that are performing primary functions and forming a group of servers from the plurality of servers for performing the one or more data center functions based on the power use.

Example Embodiments

Data center costs are driven by power (required power, backup power, electrical and power distribution equipment), land and building costs (construction, maintenance, permits, taxes), cooling costs (cooling equipment and power to drive the cooling equipment), network connectivity (e.g., fiber optic connections), and repair, infrastructure maintenance, and upgrade costs. If a data center is placed in an electric appliance, many of these requirements and costs may be eliminated. For example, use of an electric appliance based data center in place of a conventional data center eliminates the cost of land, building infrastructure, local and backup power, and wiring and cabling costs for fixed server racks. Maintenance and server updates may be performed during regularly scheduled electric appliance maintenance and software updates.

For example, U.S. Patent Publication No. 2021264068A1 to Goergen et al., incorporated herein by reference in its entirety, describes an architecture by which server blades are placed in electric vehicles (EVs) and leverage computing power of those server blades as needed for various electric vehicle functions and cloud-computing functions. U.S. Patent Publication No. 20220032804A1 to Goergen et al., also incorporated herein by reference in its entirety, describes power distribution and communication for electric vehicles and U.S. Patent Publication No. 20220063429A1 to Goergen et al., also incorporated herein by reference in its entirety, describes electric vehicle charging and security.

The techniques presented herein provide yet another approach for forming a distributed data center that reduces costs and has one or more additional or other advantages. These techniques deploy numerous servers in large appliances. The large appliances host the server blades to support various cloud/distributed functions. In one or more example embodiments, the large appliances include fault managed power (FMP). In one or more example embodiments, the large appliances have space capacity to house the server blades and/or to store the server blades for replacement, etc. i.e., as a server depository.

The terms "large appliance" and "electric appliance" are used interchangeably throughout the disclosure. An electric appliance is a major appliance (commercial or domestic) that is non-portable and typically remains stationary. For example, domestic major appliances or major household appliances include washers, dryers, refrigerators, freezers, etc. Commercial electric appliances are typically installed in public places. For example, commercial electric appliances include vending machines, automated teller machines (ATMs), kiosks, gaming machines (including gambling machines), arcades, electric charging stations, etc. These are just some non-limiting examples of large appliances that provide various services to the users by performing their primary functions and the techniques presented herein are not limited to these examples.

In one or more example embodiments, the large appliances include one or more servers together with a network interface that enables one or more network communications. For example, the network interface may be a router for wired communications and/or cellular/wireless communications. The network interface is configured to transmit and receive data to create a distributed data center. The large appliances typically already include the network interface that enables network communications for performing the primary function of the appliance e.g., authorizing a credit card payment for a product in a vending machine or dispensing money from an automated teller machine (ATM). By using the same network interface to enable network communications for the servers, costs are further reduced.

Typically, electric appliances may be placed in a vicinity of one another, i.e., in geographic proximity to one another. For example, several vending machines (one for drinks and one for snacks) may be placed next to each other. As another example, several gaming machines may form a row of gambling machines in a casino. As another example, several automated teller machines (ATMs) may be placed in geographic proximity to one another to form an appliance cluster. Yet in another example, several large household appliances (washer and dryer) may also be next to each other for user convenience. Electric appliances installed in the vicinity of one another may share a power source i.e., power distribution is shared among these appliances. The electric appliances in close geographic proximity to one another that share one or more power sources are referred to as a "set of electric appliances" and/or an "appliance cluster" in this disclosure. Conveniently, the residual power (not used by the appliances to perform their primary functions) may be provided to the servers to perform one or more data center functions.

Primary function(s) are functions that relate to the intended use(s) of the electric appliance. A primary function is the main function or the function that is related to the purpose of the electric appliance. The purpose of the electric appliance is to provide one or more services, e.g., to a user. The services may involve cooling products, heating food, washing clothes, charging an electric vehicle, etc. These are just some non-limiting examples of the services provided by an electric appliance, e.g., a major household appliance or a commercial vending or gaming machine.

For example, in the case of vending machines, the primary purpose is to provide drinks or snacks and the primary functions include obtaining payment from the user, determining whether change is needed, processing a credit card payment, receiving a selection of the product, dispensing the product, dispensing change, etc. In the case of gaming machines (arcades and/or gambling), the primary purpose is to play a game. Some of the primary functions of the gaming machine include generating a winning/losing combination of elements, displaying the results of the game, obtaining payment, dispensing winnings, etc. In the case of large household appliances, such as a refrigerator, the primary function includes cooling the space inside a housing of the appliance.

In one or more example embodiments, the servers within the electric appliances may be managed by a controller or a management entity. The controller may compute power use and distribute power based on needs of the distributed data center and based on use of the electric appliances for their intended purpose. The controller may be housed within one of the electric appliances in the appliance cluster. The controller may be hosted by a power source or a remote entity. For example, the servers may be managed in a communications network (e.g., a cloud based management system).

In one or more embodiments, server resources are adjusted based on an operating environment of the electric appliances, including for example, power availability, usage, projected usage, or any combination of these or other variables. The large appliance based data center reduces the costs of hosting servers and maximizes power use. By including the servers in stationary electric appliances, the power use is more predictable, and sharing of the power is easier. Further, data communications are easy to accomplish and may be performed by a neighboring appliance in the appliance cluster. Additionally, flexibility in data and power distribution and management is accomplished based on the stationary nature of the appliance cluster.

As described in detail below, one or more example embodiments provide a method and an apparatus for incorporating control, power, cooling, security, and communications to support the large appliance based data center. The adaptation of power, cooling, and communications for data center usage are performed in conjunction with the primary functions that are performed by the electric appliances. In one or more example embodiments, a control system manages limited resources and assigns resources to fill appropriate needs at any given time, environment, or operational needs of the electric appliances. In one or more example embodiments, system functionality covers power load shedding that allows the electric appliance to have the power needed for its primary function, while the data center is a secondary function.

In one or more example embodiments, a method for providing data center functions for support of an electric appliance based cloud data center includes identifying servers located in an electric appliance and/or an electric appliance cluster, allocating resources to the servers to perform data center functions, and managing the identified servers in the electric appliances. For example, one or more cloud managers (e.g., the controller) may be used to associate the servers (e.g., perform network communications therewith), allocate resources, and manage the servers (e.g., move resources between servers). The electric appliances may form a self-adapting network that dynamically groups and/or regroups servers within a set of appliances based on network status, type and cost of power available, computational demands of the electric appliance to perform the primary function and the computational or hosting demands of the electric appliance based data center.

In one or more example embodiments, FMP and/or other power may be used to power the electric appliances (and servers therein). The power may be stored or distributed among "internal" server blades and/or "external" server blades as part of a cluster, and/or independently within a proximity. The power is supplied by one or more power sources such as an alternating current (AC) power source, a solar power source, a wind power source, other renewable energy power sources, and/or FMP source. The FMP may be used in various ways by the electric appliances e.g., by a charging station for charging the EV, by a vending machine to dispatch a product, and for providing power to the server blades hosted therein. In one or more example embodiments, FMP may be used for power sharing and/or data communications for electric appliances, i.e., the appliance cluster.

The term "Fault Managed Power" (FMP) (also referred to as Extended Safe Power (ESP)) as used herein refers to high power (e.g., >100 W), high voltage (e.g., >56V) operation with pulse power delivered on one or more wires or wire pairs. FMP is not limited to pulse power and may instead use other types of power. That is, FMP may be accomplished in a non-pulsing manner. FMP may involve fault sensing without using pulsed power. As described below, power and data are transmitted together (in-band) on at least one wire pair. FMP also includes fault detection (e.g., fault detection (safety testing) at initialization and between high voltage pulses), and pulse synchronization between power sourcing equipment (PSE) and a powered device (PD). The power may be transmitted with communications (e.g., bi-directional communications) or without communications.

The term "pulse power" (also referred to as "pulsed power") as used herein refers to power that is delivered in a sequence of pulses (alternating low direct current voltage state and high direct current voltage state) in which the voltage varies between a very small voltage (e.g., close to 0V, 3V) during a pulse-off interval and a larger voltage (e.g., >12V, >24V) during a pulse-on interval. High voltage pulse power (e.g., >56 VDC, >60 VDC, >300 VDC, ~108 VDC, ~380 VDC) may be transmitted from power sourcing equipment to a powered device for use in powering the powered device, as described, for example, in U.S. Pat. No. 11,063,630 ("Initialization and Synchronization for Pulse Power in a Network System"), which is incorporated herein by reference in its entirety. Pulse power transmission may be through cables, transmission lines, bus bars, backplanes, PCBs (Printed Circuit Boards), and power distribution systems, for example. It is to be understood that the power and voltage levels described herein are only examples and other levels may be used.

As noted above, safety testing (fault sensing) may be performed through a low voltage safety check between high voltage pulses in the pulse power system. Fault sensing may include, for example, line-to-line fault detection with low voltage sensing of the cable or components and line-to-ground fault detection with midpoint grounding. The time between high voltage pulses may be used, for example, for line-to-line resistance testing for faults and the pulse width may be proportional to DC (Direct Current) line-to-line voltage to provide touch-safe fault protection. The testing (fault detection, fault protection, fault sensing, touch-safe protection) may comprise auto-negotiation between power components. The high voltage DC pulse power may be used with a pulse-to-pulse decision for touch-safe line-to-line fault interrogation between pulses for personal safety.

In one or more embodiments, FMP (FMP/ESP) may comprise pulse power transmitted in multiple phases in a multi-phase pulse power system with pulses offset from one another between wires or wire pairs to provide continuous power. One or more example embodiments may use multi-phase pulse power to achieve less loss, with continuous uninterrupted power with overlapping phase pulses, as described in U.S. Pat. No. 11,456,883 ("Multiple Phase Pulse Power in a Network Communications System"), which is incorporated herein by reference in its entirety.

FMP may be converted into Power over Ethernet (PoE) and used to power electrical components within the electric charging station. In one or more example embodiments, power may be supplied using Single Pair Ethernet (SPE) and may include data communications (e.g., 1-10GE (Gigabit Ethernet)). The power system may be configured for PoE (e.g., conventional PoE or PoE+ at a power level <100 watts (W), at a voltage level <57 volts (V), according to IEEE 802.3af, IEEE 802.3at, or IEEE 802.3bt), Power over Fiber (PoF), advanced power over data, FMP, or any other power over communications system in accordance with current or future standards, which may be used to pass electrical power along with data to allow a single cable to provide both data connectivity and electrical power to components (e.g., battery charging components, server data components, electric vehicle components).

The servers are charged with the FMP of the big appliances/vending machines. A bi-directional FMP extended safe power (ESP) multi-drop system may be used, which allows the utility power, a local internal/external embedded battery, or other source such as solar or regenerative motor energy (renewable energy power source) to power the electric appliance and data-center-like systems. As described below in one example embodiment, power and data may be provided through use of the FMP.

FIG. 1 is a block diagram illustrating a system 100 of connected appliances with shared power distribution and communication, according to an example embodiment. The system 100 includes a plurality of appliances 110a-n depicted as a first appliance 110a and a second appliance 110n for the sake of simplicity. The system 100 further includes a main power source 140, a controller 160, connections 170, and a network 180.

This is just one example and the system 100 may include other entities or nodes depending on a particular deployment and/or use case scenario. For example, while the main power source 140 and the controller 160 are depicted as separate entities with connections 170 and network communication via the network 180, this is just one example. In one or more example embodiments, the main power source 140 and the controller 160 may be incorporated into the same appliance or different appliances based on a particular use case scenario and deployment. In one example embodiment, the controller 160 may be a distributed data center management platform deployed in a cloud.

The notations 1, 2, 3 . . . n; a, b, c, . . . n; "a-n", "a-m", "a-f" "a-g" "a-k" "a-c", and the like illustrate that the number of elements can vary depending on a particular implementation and is not limited to the number of elements being depicted or described. Additionally, the same numeric reference denotes an analogous component. As noted above, this is only an example of various components, and the number and types of components, functions, etc. may vary based on a particular deployment and use case scenario.

The plurality of appliances 110a-n are large appliances or electric appliances described above e.g., kiosks or automated teller machines (ATMs). Each of the plurality of appliances 110a-n includes components to perform the primary function and to host one or more servers for data center functions.

In one example embodiment, the plurality of appliances 110a-n are daisy-chained, via the connections 170, for multi-drop connectivity, thus providing additional possibilities for power distribution based on demand and/or proximity. The plurality of appliances 110a-n may be in an appliance cluster that shares a common power source i.e., the main power source 140. The appliance cluster includes a set of appliances in a geographic proximity to one another. While the system 100 uses FMP for power distribution, this is just an example.

Each of the plurality of appliances 110a-n includes components for the primary function(s) and server blades for data center functions. The plurality of appliances 110a-n serve a dual-purpose. Examples of the components in each appliance are described with reference to the first appliance 110a.

Specifically, the first appliance 110a includes one or more components that provide a primary function of the first appliance 110a, referred to as a kiosk or an appliance function 112, a communication infrastructure 114 (comms infra), and a first FMP module (an FMP 116). Additionally, the first appliance 110a includes a plurality of servers 118a-m, a battery 120, a second FMP module (an FMP main 122), and a switching component 124 (enable/disable) that enables or disables power supply to the appliance function 112, communication infrastructure 114, and/or the servers 118a-m. Further, the first appliance 110a includes an FMP system 130 that includes an FMP transmitter 132a (FMP TX), an FMP receiver 132b (FMP RX), a power and data interface 134 (in/out), a communications component 136, and a trust and authentication component 138 (trust & auth).

The communication infrastructure 114 includes one or more network interfaces that enable communication outside the first appliance 110a. The communication infrastructure 114 may include a cellular communication interface (4G/5G) and/or a Wi-Fi communication interface. The communication infrastructure 114 may include a router for an data connection (wired). The communication infrastructure 114 connects the first appliance 110a to the network 180.

The FMP 116 is a power system that powers components for the appliance function 112. For example, the FMP 116 may provide power to a dispensing arm of a vending machine to dispense the product and to the communication infrastructure 114 to authorize a credit card payment for the product.

The plurality of servers 118a-m perform one or more data center functions, such as computing and/or hosting. Examples of the server components are described in FIG. 6. The terms "server" and "server blade" may be used interchangeably throughout the disclosure and generically represent a data-center type server with resources required to host an "application" and/or perform a "computation".

The plurality of servers 118a-m may form a cloud data center or a portion thereof. The plurality of servers 118a-m perform data center functions to support and operate as an enterprise data center, hyperscale data center, telecom data center, managed services data center, or any other type of data center. The plurality of servers 118a-m are processors and/or computing devices, each of which may include one or more components described in FIG. 8. Operations of the plurality of servers 118a-m may be coordinated with servers in other appliances within an appliance cluster, e.g., with a plurality of servers 118a-m in the second appliance 110n.

The number of servers may vary widely (e.g., 10, 50, 550, 1,000, 5,000, 10,000, >10,000, or any other number of servers) depending on a particular deployment and use/case scenario. One or more servers are positioned in any suitable location within an electric appliance. Also, while a box is shown to depict a server, it is to be understood that the server may be cubic or any other suitable shape to allow space for other needs or functions of the electric appliance and may be positioned in any location in which sufficient space is available in the electric appliance.

In one example embodiment, the plurality of servers 118a-m may be housed in a server appliance and/or mounted on a server rack. The plurality of servers 118a-m in the server appliance are managed collectively as a group of resources of the distributed data center. The server appliance includes a housing configured for mounting in the first appliance 110a. The housing may be shaped to fit available space in the first appliance 110a.

The plurality of servers 118a-m may also be configured such that servers or server appliances may be easily added or removed, especially when the first appliance 110a is also used as a server storage depository. The plurality of servers 118a-m may be modular, enterprise maintained, operable with low power usage, and easily upgraded. Different types of servers may be provided in the first appliance 110a. For example, a first server set performs functions of the cloud data center, a second server set includes replacement server blades of smaller size, and a third server set may perform functions of the cloud data center and/or the appliance function 112 (e.g., compute cost, change due, generate random combination of symbols for a gaming scenario, etc.).

The battery 120 and the FMP main 122 supply power to the plurality of servers 118a-m. Specifically, the FMP system 130 supplies power to the FMP 116 and the FMP main 122, which then power the respective components.

The FMP system 130 receives and transmits power at the power and data interface 134. Power is supplied from the main power source 140 and transmitted to other appliances, i.e., the second appliance 110n. Power and data received at the FMP receiver 132b is converted to FMP (if needed) and delivered to the FMP 116 and/or the FMP main 122. Power may also be supplied to the FMP transmitter 132a, which provides the power to the power and data interface 134 for transmittal to the second appliance 110n via the connections 170.

Data (e.g., Internet data or other network data) is received (or obtained) and transmitted (or provided) at the communications component 136. The data may be provided to the FMP transmitter 132a for transmittal to other appliances at the power and data interface 134. In one example embodiment, data obtained from the servers 118a-m may also be uploaded and/or downloaded to a cloud data center via the network 180.

The power and data interface 134 is an example of a bi-directional power connector that supplies power to one or more appliances. Data may also be received from the FMP receiver 132b for upload to a network via the communication infrastructure 114 and/or for storage at the plurality of servers 118a-m. The communications component 136 is in communication with the trust and authentication component 138 for performing authentication functions.

The trust and authentication component 138 performs a trust anchor method to authenticate FMP and FMP-based communications throughout the plurality of appliances 110a-n or a group of appliances forming a compute cluster. The trust and authentication component 138 allows for a secure trust layer to ensure communications, the FMP, and the charging utility power are all trusted. The trust and authentication component 138 is in communication with the switching component 124, which may shut down power and data if authentication fails and enable power and data if authentication succeeds.

The main power source 140 provides power to the plurality of appliances 110*a-n* via the connections 170, e.g., wires. As noted above, the main power source 140 may be housed independently as shown in FIG. 1 and/or within another appliance. The main power source 140 includes the FMP system 130, as described with reference to the first appliance 110*a*, and further includes a plurality of power sources 142*a-k* and a power converter 144.

Specifically, utility power and/or power from solar or wind systems may be input into the main power source 140, at 146. For example, utility alternating current (AC) power may be received at an AC power source 142*a*, and a direct current (DC) power may be received at a DC power source 142*k*. These are only examples, and the main power source 140 may be configured for receiving any type of usable power from any power source. The input power may be converted at the power converter 144 e.g., AC power to DC power or DC power to AC power. The converted power is transmitted to the FMP system 130, which includes the components described above. Specifically, power received at the FMP transmitter 132*a* is converted to FMP and delivered to the power and data interface 134 for transmittal to the plurality of appliances 110*a-n*. Power received at the power and data interface 134 (i.e., the bi-directional power connector) may also be transmitted to the FMP receiver 132*b* and converted to DC power for use by other systems.

In the system 100, the first appliance 110*a* is daisy chained with the second appliance 110*n* for multidrop connectivity for various power distributions. For example, a bi-directional FMP extended safe power (ESP) multidrop configuration allows utility power, a local internal/external embedded battery, and/or other power source, such as solar or regenerative motor energy, to power the plurality of appliances 110*a-n* and the plurality of servers 118*a-m* therein that form a data-center-like system. In addition to the power management capabilities, FMP provides for high-speed secure communication capabilities among multiple collaborating systems in the proximity, e.g., an appliance cluster shares compute and hosting resources. The system 100 is configured such that the plurality of appliances 110*a-n* share load and compute resources based on demand. The system 100 provides for efficient distribution of power and compute resources.

The controller 160 is configured to monitor power use, determine operational states (past, current, and future) of the plurality of appliances 110*a-n*, and allocate power and data center related tasks, accordingly. The controller 160 may detect a failure in one or more of the plurality of appliances 110*a-n*. For example, the failure may be indicative a faulty component within the electric appliance. As another example, the failure may be indicative of a faulty connection of the respective appliance e.g., network connection, power source connection, etc. As another example, the failure may be indicative of lack of power supply. The controller 160 detects a failure in the first appliance 110*a*, for example, and controls the main power source 140 to supply the power to the second appliance 110*n*, which then distributes the power to the other electric appliances in the zone. The controller 160 may further assign a respective server to a group of servers based on various parameters such as an amount of residual power in the appliance in which the respective server is housed and/or scheduling information and historical usage data for the appliance.

In one or more example embodiments, multiple connected electric appliances within a single household, a retail-shop, school, or event-venue kiosks share the load and compute resources based on demand and power based on availability (using bi-directional power connectors). For example, each of the multiple connected electric appliances may upload and/or download data from the servers 118*a-m* to and from a cloud data center. Additionally, an electric appliance may upload data to another electric appliance within an appliance cluster or elsewhere and may also download data from another electric appliance, the controller 160, and/or another external system.

Figure 2:
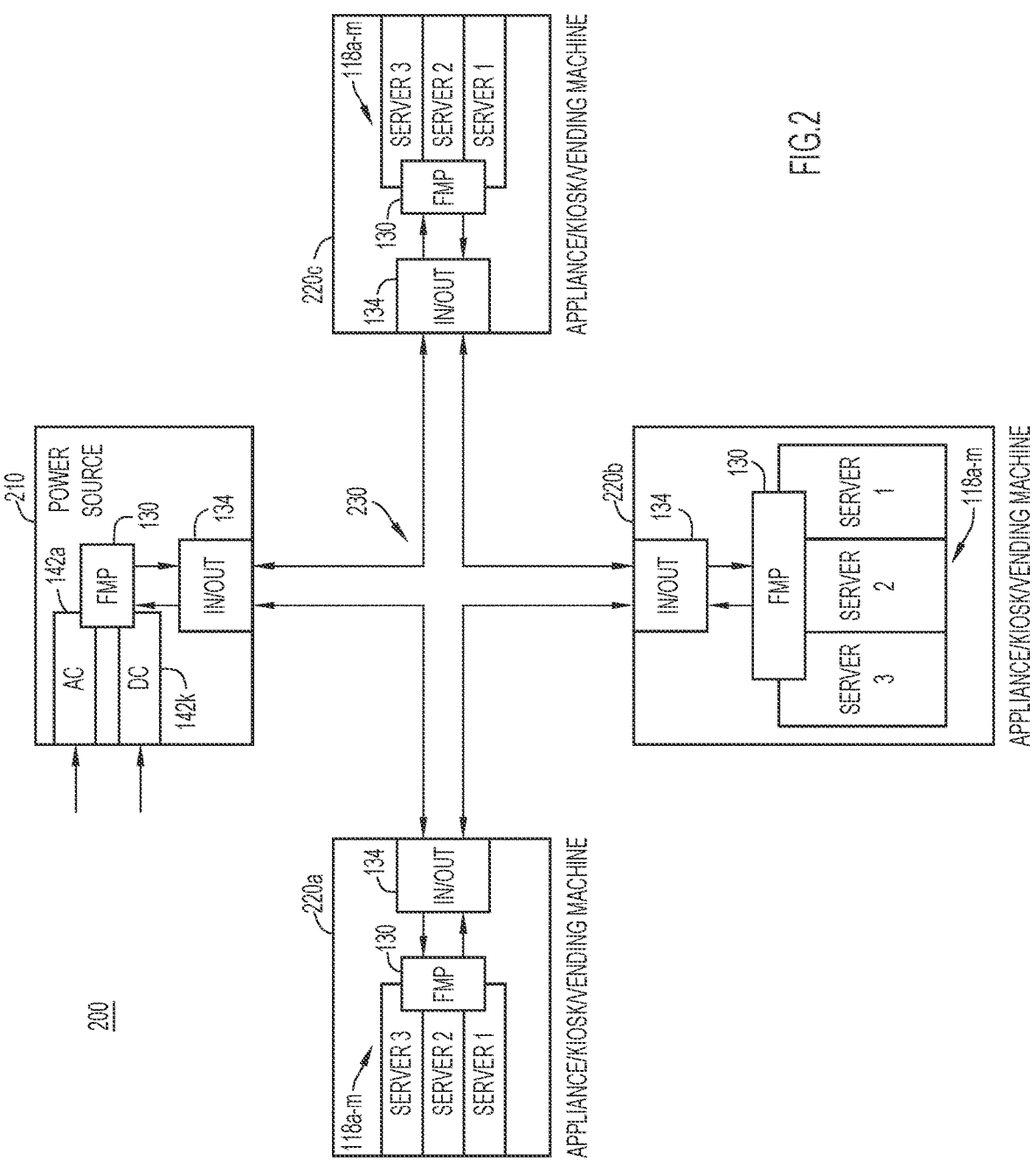
FIG. 2 is a diagram illustrating a system in which appliances are connected in a multidrop ring configuration, according to an example embodiment.

With continued reference to FIG. 1, FIG. 2 is a diagram illustrating a system 200 in which appliances are connected in a multidrop ring configuration, according to an example embodiment. The system 200 includes a power source 210 and connected appliances 220*a-c* including a first connected appliance 220*a*, a second connected appliance 220*b*, and a third connected appliance 220*c*.

The power source 210 obtains various types of power such as AC power at the AC power source 142*a* and/or DC power at the DC power source 142*k*. The power is converted to FMP at the FMP system 130 and is output to the power and data interface 134. The power is supplied to the connected appliances 220*a-c* in a ring drop configuration, at 230. For example, the power source 210 may supply power to the first connected appliance 220*a* and/or the third connected appliance 220*c*, which then supply power to the second connected appliance 220*b*. In one example embodiment, the multidrop ring configuration supplies power in both directions.

A high-speed communications method over bi-directional FMP power distribution systems allows for higher speed uploading and downloading and compute multi-threading or clustering across multiple systems while providing high availability. That is, the connected appliances 220*a-c* may exchange data using the ring drop configuration, at 230. For example, the first connected appliance 220*a* may upload first data to the second connected appliance 220*b*. The second connected appliance 220*b* may download second data from the third connected appliance 220*c* and then perform a computational operation(s) using the obtained first and second data. The connected appliances 220*a-c* form at least a part of a distributed data center or a cloud data center.

Figure 3:
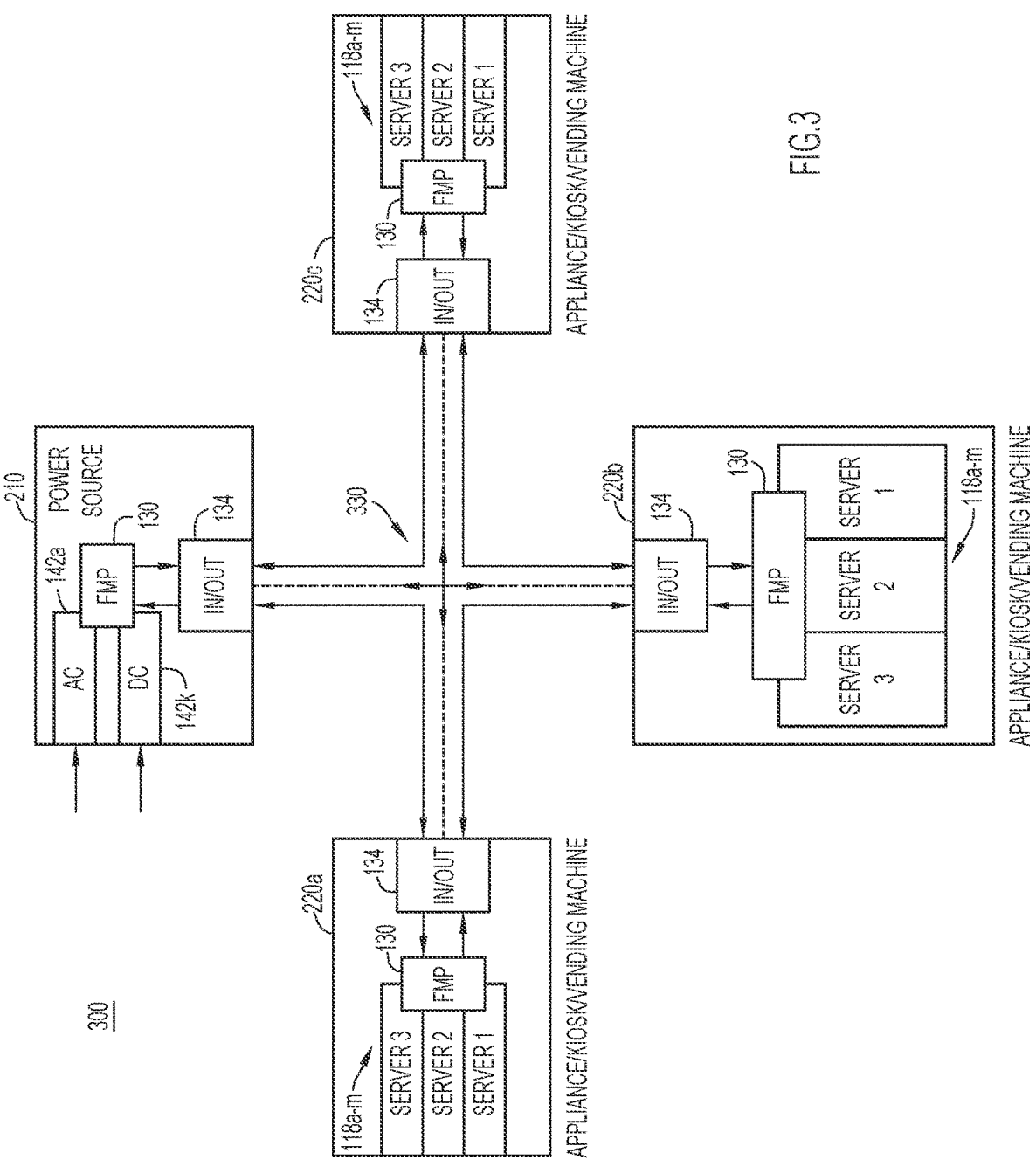
FIG. 3 is a diagram illustrating a system in which appliances are connected in a full-mesh configuration, according to an example embodiment.

With continued reference to FIGS. 1 and 2, FIG. 3 is a diagram illustrating a system 300 in which appliances are connected in a full-mesh configuration, according to an example embodiment. The system 300 includes the power source 210 and the connected appliances 220*a-c* including the first connected appliance 220*a*, the second connected appliance 220*b*, and the third connected appliance 220*c*.

The connected appliances 220*a-c* are in a full-mesh configuration, at 330, which allows an even more efficient distribution and high availability. The connected appliances 220*a-c* form at least a part of the distributed data center. The full-mesh configuration allows the third connected appliance 220*c* to download the first data directly from the first connected appliance 220*a* and perform the computational operation(s) using the downloaded first data and the generated second data. The use of resources is optimized and the second connected appliance 220*b* may perform other tasks.

These are just some non-limiting examples of interconnecting the connected appliances 220*a-c* using FMP. In one example embodiment, the configuration may be point to point.

Figure 4:
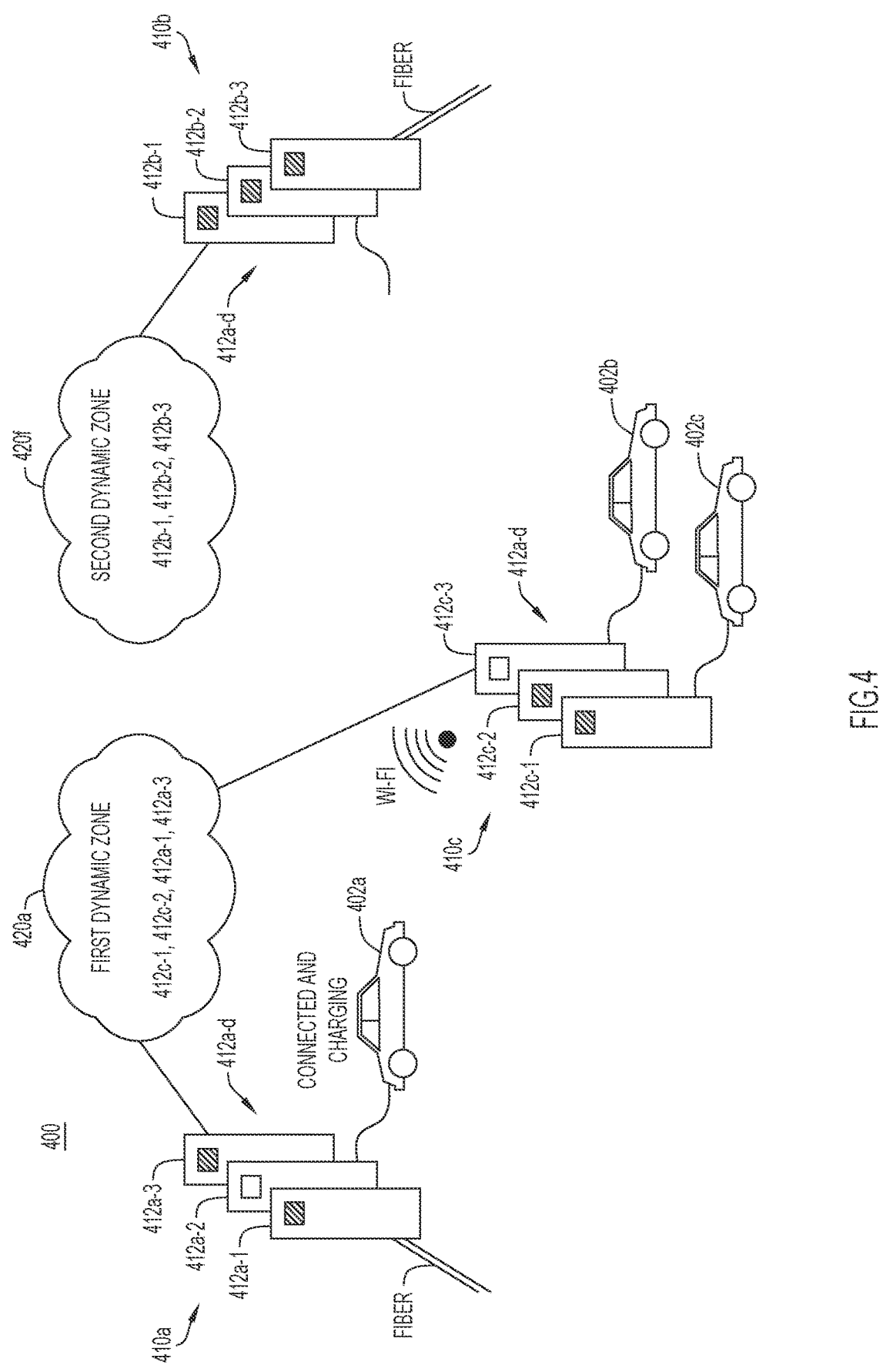
FIG. 4 is a diagram illustrating a system in which dynamic appliance zones are formed, according to an example embodiment.

FIG. 4 is a diagram illustrating a system 400 in which dynamic appliance zones are formed, according to an example embodiment. The system 400 includes a plurality of appliances such as electric charging stations that are installed in appliance clusters 410*a-c* i.e., a first appliance cluster 410*a*, a second appliance cluster 410*b*, and a third appliance cluster 410c. Each of the appliance clusters 410a-c includes a plurality of appliances (electric charging stations 412a-d that are configured to charge electric vehicles (EVs) 402a-c).

The charging stations 412a-d are also ad-hoc computing stations that implement cloud computing, as described in U.S. Provisional Application No. 63/508,100, filed Jun. 14, 2023, and titled "DUAL PURPOSE CHARGING STATIONS FOR ELECTRIC VEHICLES", incorporated herein by reference in its entirety. In the system 400, the non-charging times of the electric charging stations 412a-d are used as computing times, considering the distribution of the electric charging stations 412a-d being charged to be similar (and reversed) to that of EVs 402a-c.

The electric charging stations 412a-d are fixed, geographically, while dynamic zones 420a-f, to which the different electric charging stations 412a-d belong are varied temporally based on various parameters such as historical usage information, booking, and/or scheduling information. The dynamic zones 420a-f are dynamically formed based on available power, use information, and demand. Electric charging stations may be assigned to the different dynamic zones that are different from the appliance cluster in which they belong (regardless of their geographic proximity to one another).

In one example embodiment, server blades in the electric charging stations 412a-d may be fully operational, half operational or in a stand-by mode depending on energy use (charging, completing charge/less power to an EV, booked, unused, etc.). An integrated workload optimizer (IWO) is used to manage the workload at a zone level. An ad-hoc networking may be formed on a set of electric charging stations 412a-d (e.g., *Nexus*/Silicon One) to optimize the geographical networking and energy use across server blades. That is, the server blades may have a distributed variable load, using which a self-adapting networking is formed.

By way of a non-limiting example, the first appliance cluster 410a includes a first charging station 412a-1, a second charging stations 412a-2, and a third charging station 412a-3. The first charging station 412a-1 and the third charging stations 412a-3 include one or more server blades that perform one or more data center functions. The second charging station 412a-2 may be configured to only perform the primary function of charging the EVs 402a-c. As another example, the second charging station 412a-2 may have a first EV 402a connected thereto e.g., for communications but the first EV 402a is not being charged at the second charging station 412a-2.

Similarly, the second appliance cluster 410b includes a first charging station 412b-1, a second charging station 412b-2, and a third charging station 412b-3, each of which includes one or more server blades for performing data center functions.

The third appliance cluster 410c includes a first charging station 412c-1, a second charging station 412c-2, and a third charging station 412c-3. For example, the third charging station 412c-3 may be a non-computing charging station (i.e., without server blades). As another example, the first charging station 412c-1 charges a third EV 402c and the third charging station 412c-3 has a second EV 402b connected thereto but not being charged as such, the server blades in the third charging station 412c-3 are used for data center functions. The appliances in each cluster are in geographic proximity to one another.

The dynamic zones 420a-f are formed based on a combination of parameters. The parameters may include the state or status of the charging station and/or server(s) therein, network status (type of network connection, such as IWO/*Nexus* cloud), type and cost of energy available, and/or computing demand. The state of the charging station includes whether it is performing its primary function (charging an EV). If an EV is being charged at the charging station, a charging profile may be obtained such as fast charge, partial charge, etc., to determine power needed for the primary function and the amount of residual power available. Network status may include types of communications available, e.g., high speed network connection. Additionally, charging stations powered by a renewable energy source (wind and/or solar) may be preferred over charging stations that use a conventional power source (utility power). Computing demand may include the type of computing resources needed and/or urgency and priority of the computational task.

The dynamic zones 420a-f are formed based on multiple parameters. The servers in the electric charging stations 412a-d may be grouped and regrouped, on the fly, to form dynamic zones 420a-f. The electric charging stations 412a-d may be assigned to a particular dynamic zone based on the amount of residual power available at the respective charging station. Resource intensive computation tasks are assigned to servers housed in charging stations that have large amounts of residual power for the data center functions, i.e., the ones that are not heavily used to perform their primary functions. For example, the first electric charging station 412b-1 in the second appliance cluster 410b houses at least two servers. Based on the historical usage data for the first electric charging station 412b-1, it is typically only partially used for slow charging. As such, the two servers in the first electric charging station 412b-1 may then be assigned a high priority computational task and are then powered using the preset amount of the residual power. If a user tries to book the first electric charging station 412b-1, this request may then be denied and the user may be directed to one of the other electric charging stations in the second appliance cluster 410b.

That is, charging stations are assigned to one of the dynamic zones 420a-f based on at least the amount of residual power available at a respective charging station, scheduling information for the respective charging station, and/or historical usage data for the charging. For example, if the respective charging station is typically fully used (high speed charging) during working hours, the servers housed therein may not be in use because the amount of residual power may be low and insufficient to perform data center functions.

For example, a first dynamic zone 420a is formed to include servers from the third appliance cluster 410c and the first appliance cluster 410a. Specifically, the first dynamic zone 420a includes server blades of the first charging station 412c-1, which is only partially operational because a third EV 402c is being charged therein (performing the primary function) and a second charging stations 412c-2 of the third appliance cluster 410c. The first dynamic zone 420a further includes the first charging station 412a-1 and the third charging station 412a-3, which belong to the first appliance cluster 410a. The first dynamic zone 420a is used to perform computing functions of the data center. Computing may be associated with local smart city initiatives such as smart rental for bike/cars, etc. The first dynamic zone 420a may optionally include two of the server blades in the third charging station 412c-3 because a second EV 402b is connected to the third charging stations 412c-3 but is not being charged. As such, the third charging station 412c-3 may have a substantial amount of the residual power to aid in performing at least part of the data center functions.

A second dynamic zone 420f includes server blades from the second appliance cluster 410b. The second dynamic zone 420f is used for hosting one or more applications (power control application that allocates power to charging stations or appliance clusters 410a-c). The server blades of the first charging station 412a-1 of the first appliance cluster 410a may be regrouped into the second dynamic zone 420f based on changes in the parameters. For example, the first charging station 412a-1 may complete the computational task and join the second dynamic zone 420f to host some of the power control applications.

In one or more example embodiments, one or more servers may be added to or removed from a dynamic zone based on a change in use of the respective electric appliance for performing the primary function. Also, based on changes in the amount of residual power to perform data center functions, the servers are added or removed to and from the dynamic zone. The dynamic zones may be formed based on historical usage data for charging the EVs by the electric charging stations.

Figure 5:
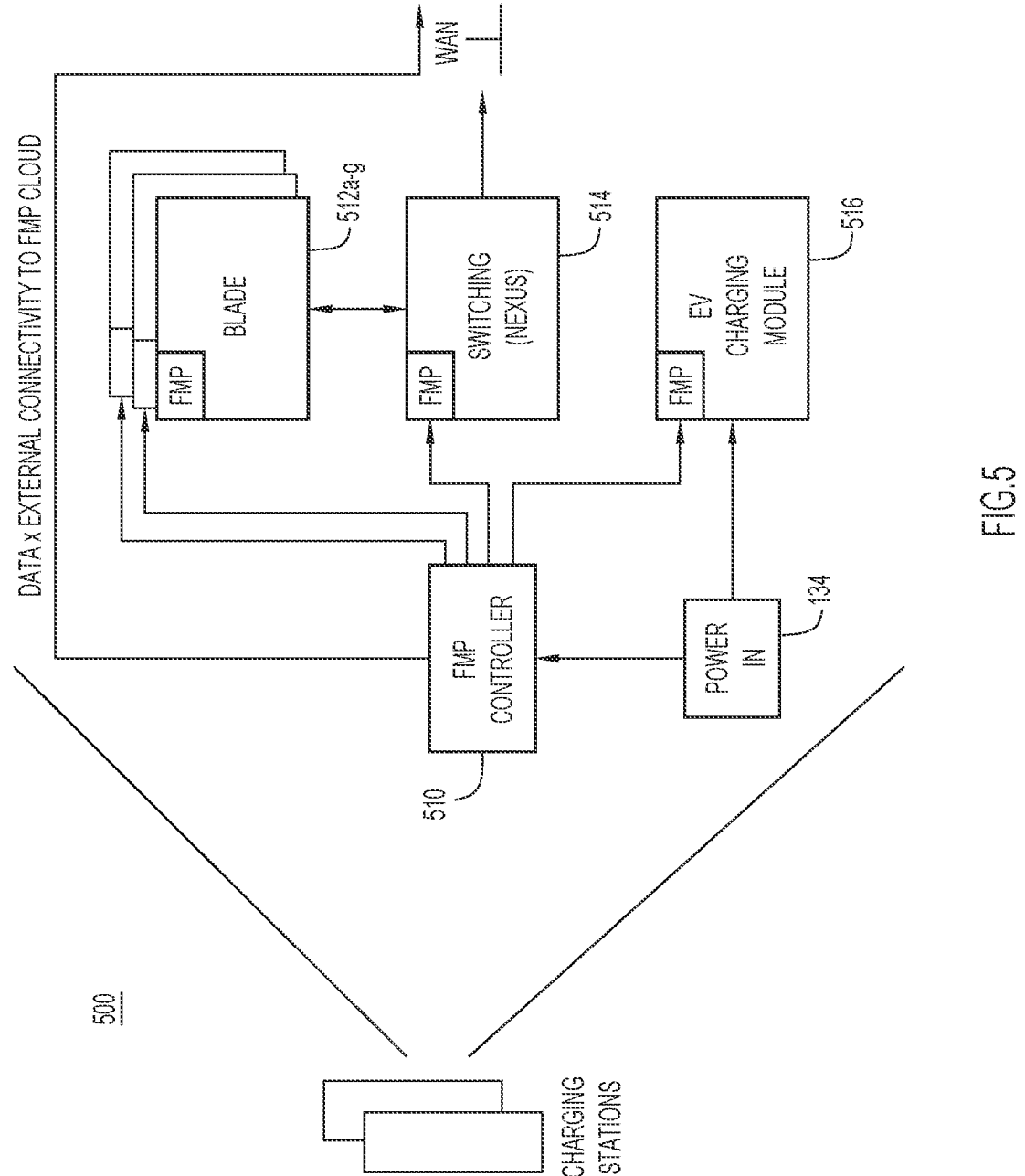
FIG. 5 is a block diagram illustrating components of an individual charging station, according to an example embodiment.

With continued reference to FIGS. 1 and 4, FIG. 5 is a block diagram illustrating components of an electric charging station 500, according to an example embodiment. The electric charging station 500 includes an FMP controller 510, a plurality of server blades 512a-g, a switch 514, an EV charging module 516, and the power and data interface 134.

The power and data interface 134 receives power from one or more power sources and powers the components of the electric charging station 500. Specifically, the power and data interface 134 supplies power to the FMP controller 510 and/or the EV charging module 516 that charges an EV.

The FMP controller 510 has an overview of the load applied on the electric charging station 500 and/or with respect to a set of locally connected charging stations (e.g., electric charging stations 412a-d in the first appliance cluster 410a). Based on the instantaneous or current load and the information received from an FMP cloud (not shown), the FMP controller 510 schedules the supply of energy to different subsystems/components. The FMP controller 510 may schedule a certain amount of power supply to the EV charging module 516 depending on the demand (partially being charged, at the beginning of charging, towards the end of charging, etc.) and the residual power may be supplied to the server blades 512a-g. Additionally, the FMP controller 510 controls the supply of power to the switch 514, which enables external communications via a wide area network (WAN), for example. The FMP controller 510 controls receiving and transmitting data to an FMP cloud (not shown) or another external entity, e.g., such as another electric charging station.

The techniques presented herein integrate the computing blades as well as the receiving blades and the charging system of electric vehicles with an FMP receiver to manage the exchange of information, authentication, and scheduling of energy delivery.

Figure 6:
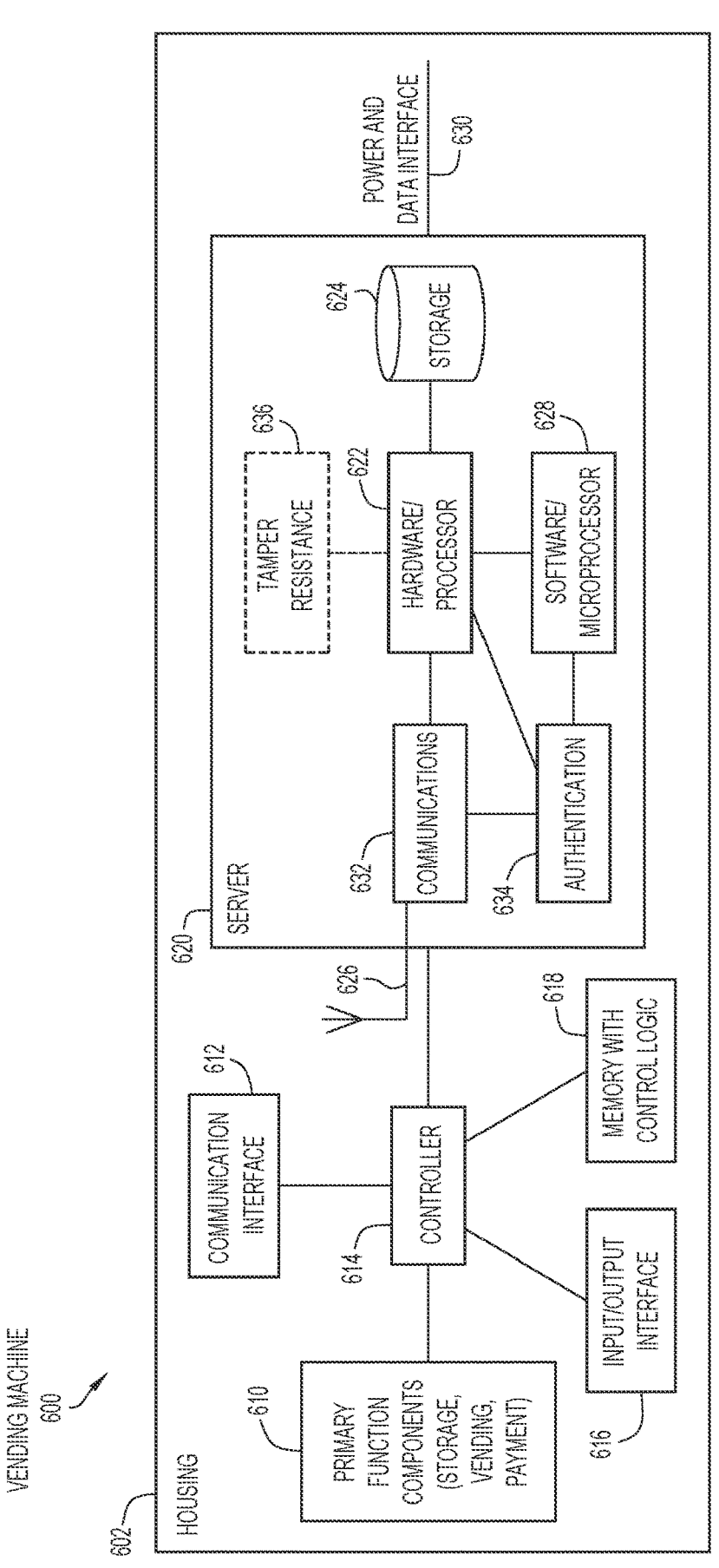
FIG. 6 is a block diagram illustrating components of a vending machine, according to an example embodiment.

FIG. 6 is a block diagram illustrating components of a vending machine 600, according to an example embodiment. The vending machine 600 includes a housing 602, primary components for storage, vending, and payment (primary function components 610), a communication interface 612, a controller 614, an input/output interface 616, a memory 618 that stores control logic, and one or more server blades, shown as a server 620. In one example embodiment, the vending machine 600 may house at least two server blades.

The vending machine 600 may be of various shapes and sizes, e.g., approximately 5 feet tall and 3 inches wide for a snack machine. The vending machine 600 may include other components not shown or described, such as standing legs, displays, power cord and power plug for receiving utility power, etc.

The housing 602 houses various components of the vending machine 600 and protects the components from environmental elements. The housing 602 is a casing enclosing at least some of the components therein. The housing 602 may be of various materials, such as glass, steel, aluminum, plastic, other metals, rubber, etc. For example, the housing 602 may include transparent material for a display window, metal and rubber for exterior cover, plastic for internal shelves on which the products are placed.

In one example embodiment, the server blades may include their own housing, i.e., housed in a server appliance. For example, at least two servers are housed in the server appliance.

The primary function components 610 may include a dispensing component that is configured to dispense the product from the storage area. The dispensing component may include an arm that is moved by one or more motors or actuators. The arm is configured to pick up a selected product from a shelf and drop it into a chute, delivery door, delivery tray, etc., for pickup by the user. The primary function components 610 may further include a cooling component that is configured to cool the products on the shelves. The primary function components 610 may further include a mechanism for receiving payment and dispensing change. In one example embodiment, the mechanism includes a magnetic card reader or a radio frequency identifier (RFID) reader. The mechanism may further or alternatively include a change dispenser and a bill receiver, etc. For the sake of simplicity, additional details of the primary function components 610 are omitted.

The communication interface 612 is configured to provide communication outside the vending machine 600. For example, the communication interface 612 may include a router and/or a modem. The communication interface 612 may be configured to communicate with the controller 614 to authorize credit card payment and/or to provide data communication for the server 620 with other servers of the distributed data center.

The controller 614 is configured to control operations of the vending machine 600 and the components therein. For example, the controller 614 may control the primary function components 610 to receive payment, validate payment via the communication interface 612, and dispense the product. The controller 614 may further distribute residual power to server 620 to perform one or more data center functions.

The input/output interface 616 is configured to receive input from a user e.g., a keypad, to receive the product selection. The input/output interface 616 is further configured to output one or more messages/notifications to the user. For example, the input/output interface 616 may include a display or a touchscreen display that notifies the user of the product selection, credit card authorization state, and the state of the vending machine 600, e.g., dispensing. As another example, the input/output interface 616 may include a microphone and a speaker to orally communicate with the user, etc.

The memory 618 stores the control logic for the controller and other components of the vending machine 600.

The server 620 may include a power system and/or communications system or may use the one installed in the vending machine 600. In one or more example embodiments, the server 620 is a programmable machine that may be implemented in hardware, software, or any combination thereof. The server 620 includes one or more processors 622 (e.g., hardware/processor), a memory 624 (local or cloud storage), a wireless interface 626, software 628 (e.g., controller, authentication software, logic, microprocessor), and a power and data interface 630.

The memory 624 may be a volatile memory or non-volatile storage, which stores various applications, operating systems, modules, and data for execution and use by the one or more processors 622. The memory 624 may include any number of memory components. Logic (software, firmware, control logic, code) may be encoded in one or more tangible media for execution by the one or more processors 622. For example, the one or more processors 622 may execute codes stored in a computer-readable medium, such as the memory 624. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. The server 620 may include any number of processors or microprocessors.

The server 620 includes a power and data interface 630 to provide power to the components from the electric vehicle battery or power system. Power may be delivered directly from the battery or may be modified for delivery as FMP or PoE, as described in detail above.

The server 620 may include one or more components to address security. For example, the server 620 may include a communications module 632 including one or more security features, a hardware/software trust authentication module 634, and a tamper resistant device or mechanism 636.

It is to be understood that the server 620 is only an example, and that different configurations of devices (with more or fewer components) may be used. For example, the server 620 may further include any suitable combination of hardware, software, algorithms, processors, devices, components, or elements operable to facilitate the capabilities described herein.

FIG. 7 is a flowchart illustrating a method 700 of performing at least one data center function by one or more servers housed in the electric appliance using residual power, according to an example embodiment. The method 700 may be performed by an electric appliance, such as a vending machine 600 of FIG. 6. In one example embodiment, the method 700 may be performed by an electric charging station 500 of FIG. 5 or another electric appliance(s) of FIGS. 1-4.

The method 700 involves, at 702, identifying a plurality of servers that form a zone of a distributed data center and are housed in a plurality of connected electric appliances. Each of the plurality of servers includes at least one processor for performing one or more data center functions.

The method 700 further involves at 704, determining a power use of the plurality of connected electric appliances that are performing primary functions.

The method 700 further involves at 706, forming a group of servers from the plurality of servers for performing the one or more data center functions based on the power use.

According to one or more example embodiments, the plurality of connected electric appliances may be stationary electric appliances that share at least one power source and are in a geographic proximity to one another.

In one instance, the operation 706 of forming the group of servers for performing the one or more data center functions may include assigning a respective server from the plurality of servers to the group of servers based on a plurality of parameters. The plurality of parameters may include one or more of: an amount of residual power based on a respective electric appliance performing a respective primary function, scheduling information for performing the respective primary function by the respective electric appliance, or historical usage data for performing the respective primary function.

In one form, the method 700 may further involve detecting a change in use of a respective electric appliance for performing a respective primary function from the plurality of connected electric appliances. The method 700 may further involve adding to the group of servers or removing from the group of servers, a respective server of the respective electric appliance based on detecting the change in the use.

According to one or more example embodiments, the respective electric appliance may house at least two servers and may include a data and power interface that performs network communications with the distributed data center and distributes data and power among the at least two servers.

Figure 8:
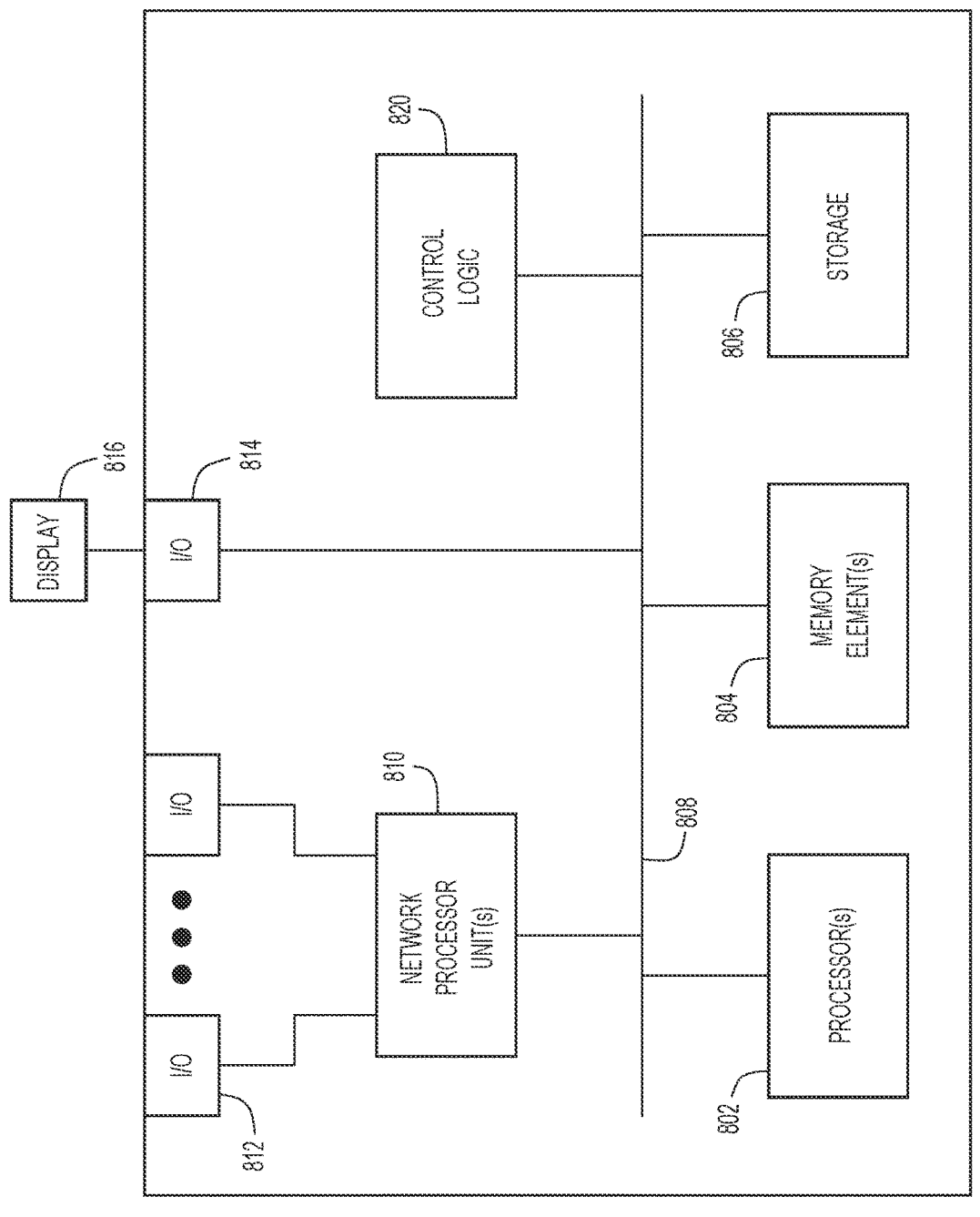
FIG. 8 is a hardware block diagram of a computing device that may perform functions associated with any combination of operations in connection with the techniques depicted and described in FIGS. 1-7, according to various example embodiments.

FIG. 8 is a hardware block diagram of a computing device 800 that may perform at least some of the functions associated with any combination of operations in connection with the techniques depicted in FIGS. 1-7, according to various example embodiments, including, but not limited to, operations of the computing device, electric appliances, or one or more servers of FIG. 1. The computing device 800 may be representative of one of the server blades, server appliance, and/or electric appliance e.g., gaming machine. It should be appreciated that FIG. 8 provides only an illustration of one example embodiment and does not imply any limitations with respect to the environments in which different example embodiments may be implemented. Many modifications to the depicted environment may be made.

In at least one embodiment, computing device 800 may include one or more processor(s) 802, one or more memory element(s) 804, storage 806, a bus 808, one or more network processor unit(s) 810 interconnected with one or more network input/output (I/O) interface(s) 812, one or more I/O interface(s) 814, and control logic 820. In various embodiments, instructions associated with logic for computing device 800 can overlap in any manner and are not limited to the specific allocation of instructions and/or operations described herein.

In at least one embodiment, processor(s) 802 is/are at least one hardware processor configured to execute various tasks, operations and/or functions for computing device 800 as described herein according to software and/or instructions configured for computing device 800. Processor(s) 802 (e.g., a hardware processor) can execute any type of instructions associated with data to achieve the operations detailed herein. In one example, processor(s) 802 can transform an element or an article (e.g., data, information) from one state or thing to another state or thing. Any of potential processing elements, microprocessors, digital signal processor, baseband signal processor, modem, PHY, controllers, systems, managers, logic, and/or machines described herein can be construed as being encompassed within the broad term 'processor'.

In at least one embodiment, one or more memory element(s) 804 and/or storage 806 is/are configured to store data, information, software, and/or instructions associated with computing device 800, and/or logic configured for memory element(s) 804 and/or storage 806. For example, any logic described herein (e.g., control logic 820) can, in various embodiments, be stored for computing device 800 using any combination of memory element(s) 804 and/or storage 806. Note that in some embodiments, storage 806 can be consolidated with one or more memory elements 804 (or vice versa), or can overlap/exist in any other suitable manner.

In at least one embodiment, bus 808 can be configured as an interface that enables one or more elements of computing device 800 to communicate in order to exchange information and/or data. Bus 808 can be implemented with any architecture designed for passing control, data and/or information between processors, memory elements/storage, peripheral devices, and/or any other hardware and/or software components that may be configured for computing device 800. In at least one embodiment, bus 808 may be implemented as a fast kernel-hosted interconnect, potentially using shared memory between processes (e.g., logic), which can enable efficient communication paths between the processes.

In various embodiments, network processor unit(s) 810 may enable communication between computing device 800 and other systems, entities, etc., via network I/O interface(s) 812 to facilitate operations discussed for various embodiments described herein. In various embodiments, network processor unit(s) 810 can be configured as a combination of hardware and/or software, such as one or more Ethernet driver(s) and/or controller(s) or interface cards, Fibre Channel (e.g., optical) driver(s) and/or controller(s), and/or other similar network interface driver(s) and/or controller(s) now known or hereafter developed to enable communications between computing device 800 and other systems, entities, etc. to facilitate operations for various embodiments described herein. In various embodiments, network I/O interface(s) 812 can be configured as one or more Ethernet port(s), Fibre Channel ports, and/or any other I/O port(s) now known or hereafter developed. Thus, the network processor unit(s) 810 and/or network I/O interface(s) 812 may include suitable interfaces for receiving, transmitting, and/or otherwise communicating data and/or information in a network environment.

I/O interface(s) 814 allow for input and output of data and/or information with other entities that may be connected to computing device 800. For example, I/O interface(s) 814 may provide a connection to external devices such as a keyboard, keypad, a touch screen, and/or any other suitable input device now known or hereafter developed. In some instances, external devices can also include portable computer readable (non-transitory) storage media such as database systems, thumb drives, portable optical or magnetic disks, and memory cards. In still some instances, external devices can be a mechanism to display data to a user, such as, for example, a display 816 such as a computer monitor, a display screen, or the like.

In various embodiments, control logic 820 can include instructions that, when executed, cause processor(s) 802 to perform operations, which can include, but not be limited to, providing overall control operations of computing device; interacting with other entities, systems, etc. described herein; maintaining and/or interacting with stored data, information, parameters, etc. (e.g., memory element(s), storage, data structures, databases, tables, etc.); combinations thereof; and/or the like to facilitate various operations for embodiments described herein.

In another example embodiment, an apparatus is provided. The apparatus includes a memory, a network interface configured to enable network communications, and a processor. The processor is configured to perform a method including identifying a plurality of servers that form a zone of a distributed data center and are housed in a plurality of connected electric appliances. Each of the plurality of servers includes at least one processor for performing one or more data center functions. The method further includes determining a power use of the plurality of connected electric appliances that are performing primary functions and forming a group of servers from the plurality of servers for performing the one or more data center functions based on the power use.

In yet another example embodiment, an electric appliance is provided. The electric appliance includes a housing, a network interface configured to enable network communications, and at least one primary appliance component that is housed within the housing and that performs a primary function of the electric appliance. The electric appliance further includes at least one server that is housed within the housing and includes at least one processor configured to perform one or more data center functions. The electric appliance further includes a power module that supplies power to the at least one primary appliance component that performs the primary function of the electric appliance and that supplies residual power to the at least one server that performs the one or more data center functions.

In one form, the electric appliance may be a stationary electric appliance that provides one or more services to a user by performing the primary function while being supplied with the power from the power module.

In another form, the electric appliance may be one of a kiosk, a vending machine, an automated teller machine (ATM), a gaming machine, a charging station that charges a battery of an electric vehicle, a cooling appliance, or a major household appliance.

According to one or more example embodiments, the at least one server may perform a computing operation associated with the primary function of the electric appliance using the power and the one or more data center functions using the residual power.

In one instance, the power module may include a bi-directional power connector that further supplies the power to at least one other electric appliance.

According to one or more example embodiments, the power module may obtain the power from one or more power sources external to the electric appliance and may convert the power to a fault managed power for supply to the at least one primary appliance component and the at least one server.

In one form, the electric appliance may further include an authentication component that authenticates performing the primary function and access to the at least one server.

In another form, the at least one server may include a plurality of servers that upload and download data to and from a cloud data center over the network interface.

In yet another example embodiment, one or more non-transitory computer readable storage media encoded with instructions are provided. When the media is executed by a processor, the instructions cause the processor to execute a method that includes identifying a plurality of servers that form a zone of a distributed data center and are housed in a plurality of connected electric appliances. Each of the plurality of servers includes at least one processor for performing one or more data center functions. The method further involves determining a power use of the plurality of connected electric appliances that are performing primary functions and forming a group of servers from the plurality of servers for performing the one or more data center functions based on the power use.

In yet another example embodiment, a system is provided that includes the devices and operations explained above with reference to FIGS. 1-8.

In yet another example embodiment, a system is provided that includes a plurality of electric appliances. Each electric appliance includes one or more servers that are a part of a distributed data center. Each of the plurality of electric appliances performs a primary function. The system further includes a bi-directional power and data connector installed in each of the plurality of electric appliances for receiving and/or transmitting power and data. The system further includes at least one power source that provides power to one or more of the plurality of electric appliances.

In one form, the plurality of electric appliances may be stationary electric appliances in which the one or more servers form a zone of the distributed data center and share performing one or more data center functions.

According to one or more example embodiments, the at least one power source may supply the power to a first electric appliance of the plurality of electric appliances. The first electric appliance may distribute the power to other electric appliances in the zone. The system may further include a controller that controls a power distribution among the plurality of electric appliances in the zone. Based on the controller detecting a failure of the first electric appliance, the controller may control the at least one power source to supply the power to a second electric appliance in the zone. The second electric appliance may distribute the power to the other electric appliances in the zone.

In one instance, the power may include one or more of an alternating current (AC) power or a direct current (DC) power. At least one power source may include a power converter that converts the power to a fault managed power for use by the plurality of electric appliances in the zone.

According to one or more example embodiments, the bi-directional power and data connector in each respective electric appliance is connected to other electric appliances in the zone for receiving from the one or more servers, or transmitting to the one or more servers, the power and the data.

In one form, the system may further include an authentication component that authenticates performing the primary function and accessing a respective server installed at a respective electric appliance from the plurality of electric appliances.

In yet another form, the plurality of electric appliances may include one or more of a plurality of gaming machines, a plurality of kiosks, a plurality of vending machines, a plurality of automated teller machines (ATMs), a plurality of charging stations that charge batteries of a plurality of electric vehicles, a plurality of cooling appliances, or a plurality of major household appliances.

The programs described herein (e.g., control logic 820) may be identified based upon the application(s) for which they are implemented in a specific embodiment. However, it should be appreciated that any particular program nomenclature herein is used merely for convenience, and thus the embodiments herein should not be limited to use(s) solely described in any specific application(s) identified and/or implied by such nomenclature.

In various embodiments, entities as described herein may store data/information in any suitable volatile and/or non-volatile memory item (e.g., magnetic hard disk drive, solid state hard drive, semiconductor storage device, random access memory (RAM), read only memory (ROM), erasable programmable read only memory (EPROM), application specific integrated circuit (ASIC), etc.), software, logic (fixed logic, hardware logic, programmable logic, analog logic, digital logic), hardware, and/or in any other suitable component, device, element, and/or object as may be appropriate. Any of the memory items discussed herein should be construed as being encompassed within the broad term 'memory element'. Data/information being tracked and/or sent to one or more entities as discussed herein could be provided in any database, table, register, list, cache, storage, and/or storage structure: all of which can be referenced at any suitable timeframe. Any such storage options may also be included within the broad term 'memory element' as used herein.

Note that in certain example implementations, operations as set forth herein may be implemented by logic encoded in one or more tangible media that are capable of storing instructions and/or digital information and may be inclusive of non-transitory tangible media and/or non-transitory computer readable storage media (e.g., embedded logic provided in: an ASIC, digital signal processing (DSP) instructions, software [potentially inclusive of object code and source code], etc.) for execution by one or more processor(s), and/or other similar machine, etc. Generally, the storage 806 and/or memory elements(s) 804 can store data, software, code, instructions (e.g., processor instructions), logic, parameters, combinations thereof, and/or the like used for operations described herein. This includes the storage 806 and/or memory elements(s) 804 being able to store data, software, code, instructions (e.g., processor instructions), logic, parameters, combinations thereof, or the like that are executed to carry out operations in accordance with teachings of the present disclosure.

In some instances, software of the present embodiments may be available via a non-transitory computer useable medium (e.g., magnetic or optical mediums, magneto-optic mediums, CD-ROM, DVD, memory devices, etc.) of a stationary or portable program product apparatus, downloadable file(s), file wrapper(s), object(s), package(s), container(s), and/or the like. In some instances, non-transitory computer readable storage media may also be removable. For example, a removable hard drive may be used for memory/storage in some implementations. Other examples may include optical and magnetic disks, thumb drives, and smart cards that can be inserted and/or otherwise connected to a computing device for transfer onto another computer readable storage medium.

Embodiments described herein may include one or more networks, which can represent a series of points and/or network elements of interconnected communication paths for receiving and/or transmitting messages (e.g., packets of information) that propagate through the one or more networks. These network elements offer communicative interfaces that facilitate communications between the network elements. A network can include any number of hardware and/or software elements coupled to (and in communication with) each other through a communication medium. Such networks can include, but are not limited to, any local area network (LAN), virtual LAN (VLAN), wide area network (WAN) (e.g., the Internet), software defined WAN (SD-WAN), wireless local area (WLA) access network, wireless wide area (WWA) access network, metropolitan area network (MAN), Intranet, Extranet, virtual private network (VPN), Low Power Network (LPN), Low Power Wide Area Network (LPWAN), Machine to Machine (M2M) network, Internet of Things (IoT) network, Ethernet network/switching system, any other appropriate architecture and/or system that facilitates communications in a network environment, and/or any suitable combination thereof.

Networks through which communications propagate can use any suitable technologies for communications including wireless communications (e.g., 4G/5G/nG, IEEE 802.11 (e.g., Wi-Fi®/Wi-Fi6®), IEEE 802.16 (e.g., Worldwide Interoperability for Microwave Access (WiMAX)), Radio-Frequency Identification (RFID), Near Field Communication (NFC), Bluetooth™ mm.wave, Ultra-Wideband (UWB), etc.), and/or wired communications (e.g., T1 lines, T3 lines, digital subscriber lines (DSL), Ethernet, Fibre Channel, etc.). Generally, any suitable means of communications may be used, such as electric, sound, light, infrared, and/or radio, to facilitate communications through one or more networks in accordance with embodiments herein. Communications, interactions, operations, etc., as discussed for various embodiments described herein, may be performed among entities that may be directly or indirectly connected utilizing any algorithms, communication protocols, interfaces, etc. (proprietary and/or non-proprietary) that allow for the exchange of data and/or information.

Communications in a network environment can be referred to herein as 'messages', 'messaging', 'signaling', 'data', 'content', 'objects', 'requests', 'queries', 'responses', 'replies', etc. which may be inclusive of packets. As referred to herein, the terms may be used in a generic sense to include packets, frames, segments, datagrams, and/or any other generic units that may be used to transmit communications in a network environment. Generally, the terms refer to a formatted unit of data that can contain control or routing information (e.g., source and destination address, source and destination port, etc.) and data, which is also sometimes referred to as a 'payload', 'data payload', and variations thereof. In some embodiments, control or routing information, management information, or the like can be included in packet fields, such as within header(s) and/or trailer(s) of packets. Internet Protocol (IP) addresses discussed herein and in the claims can include any IP version 4 (IPv4) and/or IP version 6 (IPv6) addresses.

To the extent that embodiments presented herein relate to the storage of data, the embodiments may employ any number of any conventional or other databases, data stores or storage structures (e.g., files, databases, data structures, data, or other repositories, etc.) to store information.

Note that in this Specification, references to various features (e.g., elements, structures, nodes, modules, components, engines, logic, steps, operations, functions, characteristics, etc.) included in 'one embodiment', 'example embodiment', 'an embodiment', 'another embodiment', 'certain embodiments', 'some embodiments', 'various embodiments', 'other embodiments', 'alternative embodiment', and the like are intended to mean that any such features are included in one or more embodiments of the present disclosure, but may or may not necessarily be combined in the same embodiments. Note also that a module, engine, client, controller, function, logic or the like as used herein in this Specification, can be inclusive of an executable file comprising instructions that can be understood and processed on a server, computer, processor, machine, compute node, combinations thereof, or the like and may further include library modules loaded during execution, object files, system files, hardware logic, software logic, or any other executable modules.

It is also noted that the operations and steps described with reference to the preceding figures illustrate only some of the possible scenarios that may be executed by one or more entities discussed herein. Some of these operations may be deleted or removed where appropriate, or these steps may be modified or changed considerably without departing from the scope of the presented concepts. In addition, the timing and sequence of these operations may be altered considerably and still achieve the results taught in this disclosure. The preceding operational flows have been offered for purposes of example and discussion. Substantial flexibility is provided by the embodiments in that any suitable arrangements, chronologies, configurations, and timing mechanisms may be provided without departing from the teachings of the discussed concepts.

As used herein, unless expressly stated to the contrary, use of the phrase 'at least one of', 'one or more of', 'and/or', variations thereof, or the like are open-ended expressions that are both conjunctive and disjunctive in operation for any and all possible combinations of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further, as referred to herein, 'at least one of' and 'one or more of' can be represented using the '(s)' nomenclature (e.g., one or more element(s)).

Each example embodiment disclosed herein has been included to present one or more different features. However, all disclosed example embodiments are designed to work together as part of a single larger system or method. This disclosure explicitly envisions compound embodiments that combine multiple previously discussed features in different example embodiments into a single system or method.

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained by one skilled in the art and it is intended that the present disclosure encompass all such changes, substitutions, variations, alterations, and/or modifications as falling within the scope of the appended claims.

What is claimed is:

1. An electric appliance comprising:
a housing;
a network interface configured to enable network communications;
at least one primary appliance component that is housed within the housing and that performs a primary function of the electric appliance;
at least one server that is housed within the housing and includes at least one processor configured to perform one or more data center functions; and a power module that supplies power to the at least one primary appliance component that performs the primary function of the electric appliance and that supplies residual power to the at least one server that performs the one or more data center functions, wherein the electric appliance is one of a kiosk, a vending machine, an automated teller machine (ATM), a gaming machine, a charging station that charges a battery of an electric vehicle, a cooling appliance, or a major household appliance, and wherein the electric appliance provides one or more services to a user by performing the primary function while being stationary.

2. The electric appliance of claim 1, wherein the electric appliance is a stationary electric appliance that provides the one or more services to the user by performing the primary function while being supplied with the power from the power module.

3. The electric appliance of claim 1, wherein the at least one server performs a computing operation associated with the primary function of the electric appliance using the power and the one or more data center functions using the residual power.

4. The electric appliance of claim 1, wherein the power module includes a bi-directional power connector that further supplies the power to at least one other electric appliance.

5. The electric appliance of claim 4, wherein the power module obtains the power from one or more power sources external to the electric appliance and converts the power to a fault managed power for supply to the at least one primary appliance component and the at least one server.

6. The electric appliance of claim 1, further comprising:

an authentication component that authenticates performing the primary function and access to the at least one server.

7. The electric appliance of claim 1, wherein the at least one server includes a plurality of servers that upload and download data to and from a cloud data center over the network interface.

8. The electric appliance of claim 1, wherein the electric appliance is a commercial or domestic, non-portable appliance that performs a household primary function.

9. The electric appliance of claim 1, wherein the electric appliance is a vending machine and the primary function involves dispensing an item.

10. A method comprising:

enabling network communications via a network interface for an electric appliance;

containing, within a housing of the electric appliance, at least one primary appliance component that performs a primary function of the electric appliance and at least one server that includes at least one processor configured to perform one or more data center functions;

supplying, by a power module, power to the at least one primary appliance component and a residual power to the at least one server that performs the one or more data center functions;

providing one or more services to a user by performing the primary function while being stationary; and performing, by the at least one server, a computing operation associated with the primary function of the electric appliance using the power and the one or more data center functions using the residual power.

11. The method of claim 10, wherein providing the one or more services to the user includes:

performing the primary function while being supplied with the power from the power module, wherein the electric appliance is a stationary electric appliance.

12. The method of claim 10, wherein the electric appliance is one of a kiosk, a vending machine, an automated teller machine (ATM), a gaming machine, a charging station that charges a battery of an electric vehicle, a cooling appliance, or a major household appliance.

13. The method of claim 10, further comprising:

supplying, by the power module that includes a bi-directional power connector, the power to at least one other electric appliance.

14. The method of claim 13, further comprising:

obtaining, by the power module, the power from one or more power sources external to the electric appliance; and converting the power to a fault managed power for supply to the at least one primary appliance component and the at least one server.

15. The method of claim 10, wherein the at least one server includes a plurality of servers and further comprising:

uploading and downloading data to and from a cloud data center over the network interface.

16. A method comprising:

enabling network communications via a network interface for an electric appliance;

containing, within a housing of the electric appliance, at least one primary appliance component that performs a primary function of the electric appliance and at least one server that includes at least one processor configured to perform one or more data center functions;

supplying, by a power module, power to the at least one primary appliance component and a residual power to the at least one server that performs the one or more data center functions;

providing one or more services to a user by performing the primary function while being stationary; and authenticating, by an authentication component the at least one primary appliance component for performing the primary function and access to the at least one server.

17. The method of claim 16, wherein providing the one or more services to the user includes:

performing the primary function while being supplied with the power from the power module, wherein the electric appliance is a stationary electric appliance.

18. The method of claim 16, further comprising:

obtaining, by the power module, the power from one or more power sources external to the electric appliance; and converting the power to a fault managed power for supply to the at least one primary appliance component and the at least one server.

19. A system comprising:

an electric appliance that includes:

a housing, a network interface configured to enable network communications, at least one primary appliance component that is housed within the housing and that performs a primary function of the electric appliance, at least one server that is housed within the housing and includes at least one processor configured to perform one or more data center functions, and a power module that supplies power to the at least one primary appliance component that performs the primary function of the electric appliance and that supplies residual power to the at least one server that performs the one or more data center functions, wherein the power module obtains the power from one or more power sources external to the electric appliance and converts the power to a fault managed power for supply to the at least one primary appliance component and the at least one server; and one or more external power sources that provides power to the electric appliance, wherein the electric appliance provides one or more services to a user by performing the primary function while being stationary, and wherein the power module includes a bi-directional power connector that further supplies the power to at least one other electric appliance.

20. The system of claim 19, wherein the electric appliance is a stationary electric appliance that provides the one or more services to the user by performing the primary function while being supplied with the power from the power module.

* * * * *